Feb. 10, 1970 C. A. ROSS 3,494,809

SEMICONDUCTOR PROCESSING

Filed June 5, 1967

INVENTOR.
CARL A. ROSS
BY Robert O. Vidas
ATTORNEY

United States Patent Office 3,494,809

Patented Feb. 10, 1970

3,494,809

SEMICONDUCTOR PROCESSING

Carl A. Ross, Hopkins, Minn., assignor to Honeywell, Inc., Minneapolis, Minn., a corporation of Delaware Filed June 5, 1967, Ser. No. 643,480
Int. Cl. H01l 7/44, 7/36
U.S. Cl. 148—175 4 Claims

ABSTRACT OF THE DISCLOSURE

Protection of the back side of a semiconductor wafer is provided by the use of a deposit of silicon nitride thereon during diffusion of active regions in the opposite side of the semiconductor wafer through an oxide mask.

The present invention is directed to an improved process of production of either individual semiconductor elements or multiple numbers of individual semiconductor elements within one chip of semiconductor material to provide monolithic integrated circuits.

Background of the invention

Briefly, the invention utilizes a pyrolytically deposited layer of silicon nitride on the "back" side of a semiconductor wafer as a shielding means to prevent the penetration of impurities into the body of semiconductor material during subsequent processing steps in the production of a semiconductor device or series of devices on the front side of the wafer. As is known in the art, silicon nitride provides an effective barrier to the penetration of impurities into the surface of a semiconductor body underlying the silicon nitride. Further, the silicon nitride materal has extremely high chemical resistivity to the etchants commonly used in the fabricating of semiconductor devices using silicon oxide-planar processing techniques. By use of my procedure one can produce devices which do not have extraneous electrical effects caused by impurities that have been included within the semiconductor material without definite design to do so. My invention is useful in the production of single element semiconductor devices in a single chip of semiconductor material such as a transistor. The greatest advantages are found when the invention is utilized in the production of integrated circuits in epitaxially deposited films, particularly those intended for operation at high frequencies.

Detailed description of the invention

Figure 1:
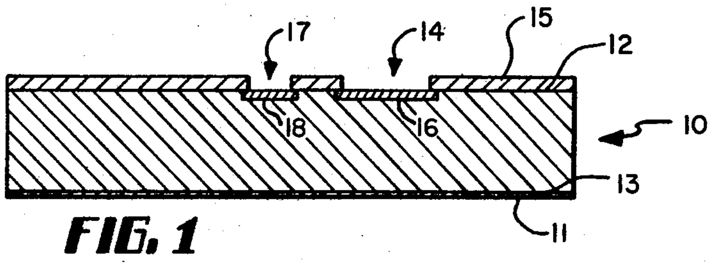
FIGURES 1 through 4 are sectional views of a sequence in the preparation of integrated circuit components utilizing the present invention.
Figure 2:
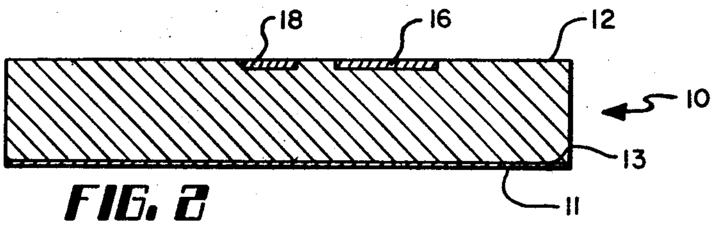

Turning first to FIGURE 1 there is illustrated a body of semiconductor material of low concentration P-type generally designated 10 having front and back side surfaces 12 and 13 respectively. Across surface 13 there has been pyrolytically deposited a layer of silicon nitride 11. The silicon nitride is pyrolytically deposited by passing a mixture of silane and ammonia in an excess of hydrogen over the wafer at a temperature of about 875° C. The thickness of the silicon nitride material should be in excess of 1000 A. to provide the necessary shielding of the semiconductor body from introduction of impurities during subsequent processing steps. The front surface 12 of the wafer is placed face down during the deposition of the silicon nitride so little or no deposit of nitride occurs on this surface. After the deposition of the silicon nitride layer 11 the wafer is oxided on the front surface 12 to produce an oxide layer 15. This oxide layer may be produced either by growth of the oxide from the material of the semiconductor body or it may be pyrolytically produced by decomposition of a silicon compound in the presence of oxygen.

Through use of photolithographic techniques in the known way holes are etched in regions 14 and 17 through the oxide layer 15 to expose surface 12 of the semiconductor body in limited areas. While the example that follows will describe an epitaxial device using a buried collector region it should be understood that one can readily follow usual planar processing to produce a circuit element in the base block of semiconductor 10. Such a procedure is described in Andrus 3,122,817.

Figure 3:
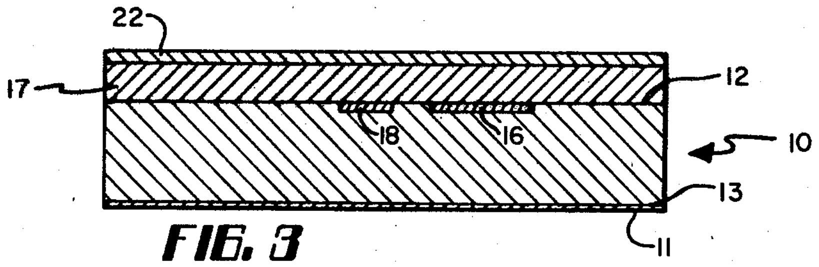
Figure 4:
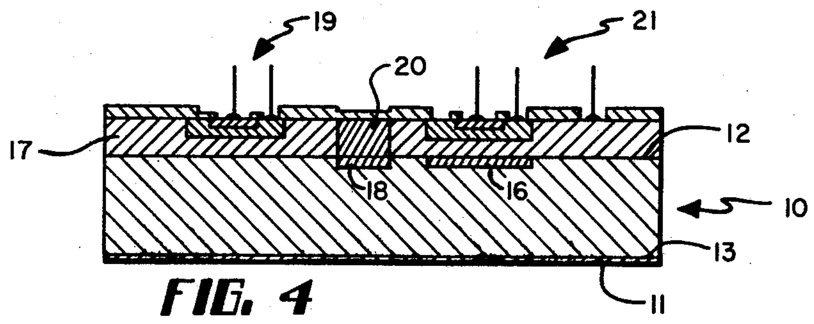

In the example of the figures a diffused region 16 of high N-type impurity concentration and a region 18 of high P-type impurity are produced for use in the fabrication of the final device shown in FIGURE 4. These steps would be of necessity sequential. That is, a first hole would be etched at 14 with deposition of an N-type impurity and diffusion to some extent into the body. Antimony would be a suitable type impurity for this step. An oxide would then be regrown to shield area 14 while a second hole 17 would be etched through the oxide with subsequent deposition of a P-type impurity such as boron. Following the diffusion of these two impurities to some limited depth into body 10 the entire surface 12 would be cleaned of oxides and surface absorbed impurities by use of hydrofluoric acid containing etchant. Inevitably some of the impurity materials utilized in the production of regions 16 and 18 would reach the back side of the wafer. However, silicon nitride is resistant to the etchants used in removal of the materials on the upper surface and thus can be readily cleaned in the hydrofluoric acid containing etchants to leave an impurity-free surface. This is important to subsequent processing of the device as any impurities that would be retained on either surface would influence the deposit of epitaxial material of the subsequent processing. It can be seen that the nitride serves two functions, first, it has prevented the introduction of impurities into the base body 10, and second, has provided an easy clean-up step that prevents extraneous impurities from being introduced into the epitaxial deposit of FIGURE 3.

In FIGURE 3 surface 12 has been covered with an epitaxial layer of N-type semiconductor material to some predetermined depth. In all of the drawings vertical heights have been greatly exaggerated to facilitate ease of understanding of the relationship of the various layers. Atop the upper surface of layer 17 there has been produced an oxide layer 18 which will be used in the planar processing techniques well known in the art to produce active device regions. As can be seen, nitride layer 11 is still intact on the back surface of wafer 10. There has also been achieved a pair of buried layers 16 and 18 of high concentration impurity semiconductor material. Layer 16 will ultimately become a buried collector in a transistor configuration, while region 18 will be utilized in providing an isolation diffusion.

In FIGURE 4 additional regions have been diffused into the epitaxial material 17 to provide a diode generally designated 19 and a transistor generally designated 21. Additional diffusion has been combined with buried region 18 to provide an isolation barrier 20 electrically isolating the diode and transistor. Nitride layer 11 has remained intact through all of the processing steps of the procedure outlined briefly above. It has provided a shield against introduction of undesired impurities into the semiconductor body at any step and has removed the necessity of removing material from the back side of the semiconductor body by abrasive techniques or etchants to remove the impurities which would be introduced onto the surface of the back side during the processing steps.

At this stage of manufacture, one can either remove the nitride layer through the use of a phosphoric acid solution or the nitride layer may be left intact depending upon the needs of the particular device. If a back side contact to the semiconductor wafer is needed one can readily provide such an electrical contact either by totally removing the nitride or by selectively etching holes through the nitride. In either event, one can readily mount the finished assembly to the desired substrate for support.

The embodiments of the invention in which an exclusive property or right is claimed are defined as follows:

1. The method of producing a diffused semiconductor device comprising:

(a) pyrolytically depositing a layer of silicon nitride greater than 1000 A. in thickness on a first surface of a semiconductor body of a first conductivity type (b) forming a silicon oxide coating on the opposing surface of said wafer (c) selectively etching at least one opening through said oxide to expose a portion of the semiconductor body (d) diffusing an impurity into the semiconductor body through said opening to form a first region of conductivity type opposite to that of said body underlying the opening.

2. The method in accordance with claim 1 wherein the oxide is stripped from the surface and a layer of opposite conductivity type semiconductor material is epitaxially grown on said opposing surface while leaving the silicon nitride layer intact on the first surface of the semiconductor body.

3. The method in accordance with claim 2 wherein at least one region of N+ and one region of P+ conductivity is produced in the body prior to the deposition of epitaxial material.

4. The method in accordance with claim 2 wherein a transistor is produced by diffusion of impurities into the epitaxial layer.

References Cited

UNITED STATES PATENTS

| | | | |
|---|---|---|---|
| 3,321,340 | 5/1967 | Murphy | 148—175 |
| 3,373,051 | 3/1968 | Chu et al. | 117—201 |
| 3,421,936 | 1/1969 | Vogel | 148—175 |

L. DEWAYNE RUTLEDGE, Primary Examiner

R. LESTER, Assistant Examiner

U.S. Cl. X.R.

29—578; 148—187